(12) United States Patent
Mawatari et al.

(10) Patent No.: US 9,647,185 B2
(45) Date of Patent: May 9, 2017

(54) COMPOSITION FOR REFLECTION FILM FOR LIGHT EMITTING ELEMENT, LIGHT EMITTING ELEMENT, AND METHOD OF PRODUCING LIGHT EMITTING ELEMENT

(75) Inventors: Fuyumi Mawatari, Naka-gun (JP); Youji Kondou, Akita (JP); Reiko Izumi, Naka-gun (JP); Yoshimasa Hayashi, Naka-gun (JP); Kazuhiko Yamasaki, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 466 days.

(21) Appl. No.: 13/884,751

(22) PCT Filed: Nov. 10, 2011

(86) PCT No.: PCT/JP2011/075952
§ 371 (c)(1),
(2), (4) Date: May 10, 2013

(87) PCT Pub. No.: WO2012/063908
PCT Pub. Date: May 18, 2012

(65) Prior Publication Data
US 2013/0234191 A1  Sep. 12, 2013

(30) Foreign Application Priority Data

Nov. 12, 2010 (JP) ................................ 2010-254268
Feb. 24, 2011 (JP) ................................ 2011-037805

(51) Int. Cl.
*H01L 33/60* (2010.01)
*H01L 33/62* (2010.01)

(52) U.S. Cl.
CPC .............. *H01L 33/60* (2013.01); *H01L 33/62* (2013.01); *H01L 2924/0002* (2013.01);
(Continued)

(58) Field of Classification Search
CPC ............ H01L 33/60; H01L 2924/0002; H01L 2933/0091; H01L 2933/0058; H01L 33/62; Y10T 428/31504
See application file for complete search history.

(56) References Cited

U.S. PATENT DOCUMENTS 6,084,343 A * 7/2000 Van De Poel ........ H01J 29/868
313/478
8,917,962 B1 * 12/2014 Nichol ................. G02B 6/0028
362/296.01
(Continued)

FOREIGN PATENT DOCUMENTS

JP   2007-180059 A   7/2007
JP   2008-135417 A   6/2008
(Continued)

OTHER PUBLICATIONS

International Search Report dated Feb. 14, 2012, issued for PCT/JP2011/075952 and English translation thereof.
(Continued)

*Primary Examiner* — Cuong B Nguyen
*Assistant Examiner* — Juanita Rhodes
(74) *Attorney, Agent, or Firm* — Locke Lord LLP; James E. Armstrong, IV; Nicholas J. DiCeglie, Jr.

(57) ABSTRACT

A light emitting element having a light emitting layer, an electro-conductive reflection film that reflects light emitted from the light emitting layer and a substrate in this order, wherein the electro-conductive reflection film contains metal nanoparticles.

1 Claim, 3 Drawing Sheets (52) U.S. Cl.
CPC .............. *H01L 2933/0058* (2013.01); *H01L 2933/0091* (2013.01); *Y10T 428/31504* (2015.04)

(56) References Cited

U.S. PATENT DOCUMENTS

| | | | | |
|---|---|---|---|---|
| 2006/0147673 | A1* | 7/2006 | Ueda | B05D 7/16 428/141 |
| 2009/0010017 | A1* | 1/2009 | Hayashi | H01L 33/44 362/516 |
| 2010/0123153 | A1* | 5/2010 | Lin | H01L 33/46 257/98 |
| 2010/0218822 | A1* | 9/2010 | Yamasaki | H01L 31/03921 136/256 |
| 2010/0219437 | A1* | 9/2010 | Usuda | H01L 33/22 257/98 |
| 2010/0260986 | A1* | 10/2010 | Ito | G06F 3/045 428/212 |
| 2010/0283081 | A1* | 11/2010 | Huang | H01L 33/387 257/99 |
| 2012/0193647 | A1* | 8/2012 | Andrews | H01L 33/60 257/88 |
| 2012/0257295 | A1* | 10/2012 | Kumagai | F24J 2/1052 359/884 |

FOREIGN PATENT DOCUMENTS

| | | |
|---|---|---|
| JP | 2008-288568 A | 11/2008 |
| JP | 2008-288586 A | 11/2008 |
| JP | 2009-065219 A | 3/2009 |
| JP | 2009-070892 A | 4/2009 |
| JP | 2009-224536 A | 10/2009 |
| JP | 2009-231568 A | 10/2009 |
| JP | 2010-170916 A | 8/2010 |
| JP | 2010-198935 A | 9/2010 |
| WO | WO-2008/059857 A1 | 5/2008 |
| WO | WO-2008/130031 A1 | 10/2008 |
| WO | WO-2010/113708 A1 | 10/2010 |
| WO | WO2011078024 A1 * | 6/2011 ............ F24J 2/1052 |

OTHER PUBLICATIONS

Office Action issued in corresponding Japanese Patent Application No. JP 2011-550333, dated Jan. 5, 2016.

* cited by examiner

COMPOSITION FOR REFLECTION FILM FOR LIGHT EMITTING ELEMENT, LIGHT EMITTING ELEMENT, AND METHOD OF PRODUCING LIGHT EMITTING ELEMENT

BACKGROUND OF THE INVENTION

Field of the Invention

The present invention relates to a composition for a reflection film for a light emitting element, a light emitting element, and a method of producing a light emitting element. Specifically, the present invention relates to a composition for a reflection film for a light emitting element that has an electro-conductive reflection film that efficiently reflects light from a light emitting layer, the light emitting element, and a method of producing the same.

Description of Prior Art

In accordance with the recent trend of enhanced brightness, light emitting elements, specifically, LED light sources are utilized in various fields. Specifically, in accordance with development of practical white color LED light source, the LED light sources are used in applications such as lighting equipment and back lights of liquid crystal displays.

Effective utilization of emission from the LED element, a light emitting layer, is investigated in order to enhance brightness or the like of the LED light source. Patent Reference 1 discloses a LED light source that has a substrate, a LED element disposed on the support substrate, an encapsulat including a fluorescent agent, an Ag plate electrode film that is disposed between the substrate and the LED element and reflects the light emission of the LED element, and a titanium thin film disposed on the Ag plate electrode film.

In this LED light source, a layer of electro-conductive reflection film is disposed between the substrate and the LED element. By this constitution, the emission intensity is enhanced by effective reflection of light from the light emitting material (luminous material). Here, the Ag thin film and the titanium thin film are formed by a plating method or a vacuum deposition method.

In general, complicated process and generation of liquid waste are anticipated in the plating process. Large cost is required for the vacuum deposition process so as to maintain and operate a large sized vacuum deposition apparatus. The above-described LED light source requires the titanium thin film since the Ag plate electrode film alone cannot escape occurrence of thermal deterioration and/or photo deterioration. Therefore, a plating process is required together with the vacuum deposition process.

The Patent Reference 2 discloses a method of producing a LED device including disposing a LED element on a substrate, forming a wire bonding, and forming a $SiO_2$ coating.

This method of producing a LED device also uses a silver plate film. In addition, since the $SiO_2$ coating is formed after the disposition of the LED element, there is a possibility of contamination of the LED element during applying the $SiO_2$ coating solution, resulting in deterioration of the yield rate.

PRIOR ART REFERENCE

Patent Reference 1: Japanese Unexamined Patent Application, First Publication No. 2009-231568.

Patent Reference 2: Japanese Unexamined Patent Application, First Publication No. 2009-224536.

DISCLOSURE OF THE INVENTION

Problems to be Solved by the Invention

An object of the present invention is to provide a light emitting element and a method of producing the light emitting element that enables large reduction of running cost through improvement of the film formation process of an electro-conductive reflection film (the film that reflects the light emitted from the light emitting element and has a role of an electrode) thereby suppressing deterioration of the electro-conductive reflection film due to heat and environmental causes and simplifying the production process thereof.

Solution of the Problems

The present invention relates to a light emitting element and a composition for an electro-conductive reflection film of the light emitting element, in which the above-described problems are solved by the below described constitutions.

A first aspect of the present invention is a composition for electro-conductive reflection film for a light emitting element, the light emitting element having a light emitting layer, an electro-conductive reflection film that reflects light emitted from the light emitting layer, and a substrate in this order, wherein the composition for electro-conductive reflection film includes metal nanoparticles.

A second aspect of the present invention is a composition for an electro-conductive reflection film for a light emitting element according to the first aspect, further including an additive material.

A third aspect of the present invention is a composition for an overcoat (overcoating composition) for an electro-conductive reflection film for a light emitting element, the light emitting element having a light emitting layer, an electro-conductive reflection film that reflects light emitted from the light emitting layer, and a substrate in this order, wherein the composition for the over coat includes a light-transmitting binder.

A fourth aspect of the present invention is a light emitting element that has a light emitting layer, an electro-conductive reflection film that reflects light emitted from the light emitting layer, and a substrate in this order (stacking sequence), wherein the electro-conductive reflection film includes a sintered body of metal nanoparticles.

A fifth aspect of the present invention is a light emitting element according to the above-described fourth aspect, wherein a light transmitting binder exists in pores of the electro-conductive reflection film and/or in an interface between the electro-conductive reflection film and the substrate.

A sixth aspect of the present invention is a light emitting element according to any one of the above-described fourth or fifth aspect, further including a transparent electro-conductive film including light transmitting binder in an interface between the light-emitting layer and the electro-conductive reflection film.

A seventh aspect of the present invention is a light emitting element according to the above-described sixth aspect, wherein the transparent electro-conductive film further includes transparent electro-conductive particles.

An eighth aspect of the present invention is a light emitting element according to the sixth or seventh aspect, wherein the transparent electro-conductive film is constituted of two layers where the refractive index of a transparent electro-conductive film (transparent electro-conductive layer) on the side of the electro-conductive reflection film is higher than the refractive index of a transparent electro-conductive film (transparent electro-conductive layer) on the side of the light emitting layer.

A ninth aspect of the present invention is a light emitting element according to any one of the above-described fourth to eighth aspect, further including an adhesion layer between the electro-conductive reflection film and the substrate.

A tenth aspect of the present invention is a light emitting element according to any one of the above-described sixth to ninth aspect, wherein the electro-conductive reflection film and the transparent electro-conductive film are produced by a wet coating method.

An eleventh aspect of the present invention is a light emitting element according to any one of the above-described fourth to tenth aspects, wherein the thickness of the electro-conductive reflection film is 0.05 to 1.0 µm.

A twelfth aspect of the present invention is a light emitting element according to any one of the above-described fourth to eleventh aspects, wherein the electro-conductive reflection film further includes an additive material.

A thirteenth aspect of the present invention is a light emitting element according to the above-described twelfth aspect, wherein the additive material includes at least one material selected from the group consisting of organic polymer, metal oxide, metal hydroxide, organic metal compound, and silicone oil.

A fourteenth aspect of the present invention is a light emitting element according to the above-described thirteenth aspect, wherein the organic polymer includes at least one organic polymer selected from the group consisting of polyvinylpyrrolidone, a copolymer of polyvinylpyrrolidone, and a water soluble cellulose.

A fifteenth aspect of the present invention is a light emitting element according to the above-described thirteenth aspect, wherein the metal oxide is constituted of oxide or compound oxide including at least one metal selected from the group consisting of aluminum, silicon, titanium, zirconium, chromium, manganese, iron, cobalt, nickel, silver, copper, zinc, molybdenum, tin, indium, and antimony.

A sixteenth aspect of the present invention is a light emitting element according to the above-described thirteenth aspect, wherein the metal hydroxide includes at least one metal selected from the group consisting of aluminum, silicon, titanium, zirconium, chromium, manganese, iron, cobalt, nickel, silver, copper, zinc, molybdenum, tin, indium, and antimony.

A seventeenth aspect of the present invention is a light emitting element according to the above-described thirteenth aspect, wherein the organic metal compound is constituted of metallic soap, a metallic complex, a metal alkoxide, or a hydrolysate of metal alkoxide of at least one selected from the group consisting of silicon, titanium, chromium, manganese, iron, cobalt, nickel, silver, copper, zinc, molybdenum, and tin.

The present invention also relates to the below described method of producing a light emitting element.

An eighteenth aspect of the present invention is a method of producing a light emitting element including: painting (coating) a composition for electro-conductive reflection film including metal nanoparticles and an additive material on a surface of a substrate by a wet-coating method; subsequently forming an electro-conductive reflection film by firing or curing the composition; and disposing a light emitting layer on the electro-conductive reflection film.

A nineteenth aspect of the present invention is a method of producing a light emitting element according to the above-described eighteenth aspect, further including painting an overcoat composition including light-transmitting binder on the surface of the electro-conductive reflection film after forming the electro-conductive reflection film and before disposing the light emitting layer; and subsequently forming a transparent electro-conductive film by firing or hardening the overcoat composition.

According to the above-described first aspect, it is possible to easily achieve an electro-conductive reflection film in which deterioration due to heat generated from the light emitting layer or due to environmental cause are suppressed even in a high power light emitting element, and it is possible to easily produce a light emitting element that is equipped with this electro-conductive reflection film and has a long service life.

According to the fourth aspect, it is possible to enhance heat resistance and corrosion resistance even in a high power light emitting element, and it is possible to provide a long life light emitting element in which deterioration of electro-conductive reflection film due to heat generated from the light emitting layer or due to environmental cause are suppressed. Since this electro-conductive reflection film can be fabricated by a wet coating method, it is possible to produce the film at a low cost while simplifying the production process of the film. According to the fifth aspect, it is possible to provide a light emitting element with further enhanced heat resistance and corrosion resistance by the effect of the additive material. According to the seventh aspect, it is possible to increase the reflection of light by the electro-conductive reflection film.

According to the above-described eighteenth aspect, it is possible to achieve a light emitting element with enhanced heat resistance and corrosion resistance simply at a low cost. In addition, since the electro-conductive reflection film is formed before disposing the light emitting layer, a possibility of contamination of the light emitting layer with the composition for forming the electro-conductive reflection film is avoided.

MODE FOR CARRYING OUT THE INVENTION

In the following, the present invention is explained specifically based on the embodiments. Where exceptional explanation or numerical symbol are not provided, "%" denotes "% by mass" in the below description.

[Composition for an Electro-Conductive Reflection Film for a Light Emitting Element]

A composition for an electro-conductive reflection film according to the present invention is a composition for electro-conductive reflection film for a light emitting element having a light emitting layer, an electro-conductive reflection film that reflects emitted light from the light emitting layer, and a substrate in this order (hereafter, referred to as a composition for electro-conductive reflection film), wherein the composition for electro-conductive reflection film includes metal nanoparticles. An electro-conductive reflection film is formed by firing or curing (hardening) the composition for the electro-conductive reflection film. Explanation for the light emitting element having a light emitting layer, an electro-conductive reflection film that reflects light from the light emitting layer, and a substrate in this order is provided afterwards.

The metal nanoparticles provide electro-conductivity and reflectivity to the light emitted from the light emitting layer to the electro-conductive reflection film, that is, the sintered or cured (hardened) composition for forming an electro-conductive reflection film. The metal nanoparticles may be constituted of one metal, or a mixture or alloy of two or more metals selected from the group consisting of silver, gold, platinum, palladium, ruthenium, nickel, copper, tin, indium, zinc, iron, chromium, and manganese. In consideration of conductivity, silver and/or gold are preferred. Preferably, the average particle diameter of the metal nanoparticles is 10 to 50 nm. Here, the average particle diameter is measured using BET method based on measurement of specific surface area using QUANTACHROME AUTOSORB-1. In consideration of dispersibility and reflectivity, a spherical or platy shape is preferred as the shape of the metal nanoparticles.

In consideration of adhesion and reflectivity, the composition for the electro-conductive reflection film preferably includes an additive material. In consideration of adhesion and reflectivity, the additive material preferably includes at least one material selected from the group consisting of an organic polymer, a metal oxide, a metal hydroxide, a metal hydroxide, an organic metal compound, and silicone oil.

In consideration of reflectivity, the organic polymer used as the additive material is preferably at least one selected from the group consisting of polyvinylpyrrolidone, copolymer of polyvinylpyrrolidone, and water soluble cellulose. As the copolymer of polyvinylpyrrolidone, PVP-methacrylate copolymer, PVP-styrene copolymer, PVP-vinyl acetate copolymer or the like may be used. The water-soluble cellulose may be selected from cellulose ethers such as hydroxypropyl metylcellulose, methylcellulose, hydroxyethyl methylcellulose.

The metal oxide used as the additive material is preferably selected from oxide or compound oxide containing at least one metal selected from the group consisting of aluminum, silicon, titanium, zirconium, chromium, manganese, iron, cobalt, nickel, silver, copper, zinc, molybdenum, tin, indium, and antimony. Specific examples of the compound oxide include the above-described ITO, ATO, IZO, AZO or the like.

The metal hydroxide used as the additive material preferably includes at least one metal selected from the group consisting of aluminum, silicon, titanium, zirconium chromium, manganese, iron, cobalt, nickel, silver, copper, zinc, molybdenum, tin, indium, and antimony.

The organic metal compound used as the additive material is preferably metal soap, a metal complex, a metal alkoxide, or a hydrolysate or a metal alkoxide of at least one metal selected from silicon, titanium, zirconium, chromium, manganese, iron, cobalt, nickel, silver, copper, zinc, molybdenum, and tin. For example, the metal soap may be selected from chromium acetate, manganese formate, iron citrate, cobalt formate, nickel acetate, molybdenum acetate or the like. Zinc acetylacetonate, chromium acetylacetonate, nickel acetylacetonate or the like may be used as the metal complex. Titanium isopropoxide, methyl silicate, isocyanate propyl trimethoxysilane, aminopropyl trimethoxysilane or the like may be used as the metal alkoxide.

Both straight silicone oil and modified silicone oil may be used as the silicone oil used as the additive material. Silicone oil (side-chain type silicone oil) with an organic base introduced to partial fraction of side chain of polysiloxiane, silicon oil (dual-end type silicone oil) with an organic base introduced to both ends of the polysiloxane, silicone oil (single-end type silicone oil) with an organic base introduced to any one of the both ends of the polysiloxane, and silicone oil (side-chain dual-end type silicone oil) with organic bases introduced to partial fraction of the side chain and both ends of polysiloxane may be used as the modified silicone oil. Modified silicone oils include reactive silicone oil and non-reactive silicone oil both of which may be used as the additive material in the present invention. The reactive silicone oil denotes a silicone oil selected from amino-modified silicone oil, epoxy-modified silicone oil, carboxy-modified silicone oil, carbinol-modified silicone oil, mercapto-modified silicone oil, or heterofunctional group-modified (epoxy group, amino group, polyether group) silicone oil. The non-reactive silicone oil denotes a silicone oil selected from polyether-modified silicone oil, methyl styryl group-modified silicone oil, alkyl-modified silicone oil, higher fatty acid ester-modified silicone oil, fluorine modified silicone oil, or hydrophilic specific modified silicone oil.

The composition for electro-conductive reflection film includes dispersion medium. Preferably, the dispersion medium contains 1% by mass or more, preferably 2% by mass or more of water, and 2% by mass or more, preferably 3% by mass or more of solvent that is soluble with water in total mass (100% by mass) of the dispersion medium. For example, the solvent may be selected from varieties of alcohols. For example, in the case in that the dispersion medium consists only of water and alcohol, the dispersion medium includes 98% by mass of alcohols where the dispersion medium includes 2% by mass of water, and the dispersion medium includes 2% by mass of alcohols where the dispersion medium includes 98% by mass of water. Further, the dispersion medium, that is, protection molecules that chemically-modify the surfaces of metal nanoparticles includes one or both of hydroxyl group (—OH) and carbonyl group (—C=O). Preferably, the amount of water is 1% by mass or more out of 100% by mass, that is, total amount of the dispersion medium. Where the amount of water is less than 1% by mass, it is difficult to sinter the film that has been obtained by coating the composition for the electro-conductive reflection film by wet coating method at low sintering temperature, and conductivity and reflectivity of the electro-conductive reflection film after the sintering are deteriorated. Where the hydroxyl group (—OH) is contained in the protective agent that chemically modifies metal nanoparticles such as silver nanoparticles, dispersion state of composition for electro-conductive reflection film is stabilized excellently, and effective function is exhibited in low temperature sintering of the coating (coated film). In the same manner as described above, the dispersion state of a composition for electro-conductive reflection film is stabilized excellently, and effective function is exhibited in low temperature sintering of the coating where the carbonyl group (—C=O) is contained in the protective agent that chemically modifies metal nanoparticles such as silver nanoparticles. Solvent that is soluble with the water used as the dispersion medium is preferably selected from alcohols. Preferably, the above-described alcohols is one or two or more selected from the group consisting of methanol, ethanol, propanol, butanol, ethylene glycol, propylene glycol, diethylene glycol, glycerol, isobornyl hexanol, and erythritol.

Preferably, resistance-lowering agent and/or water soluble cellulose derivative may be added in correspondence with the component used in the composition. Preferably, the resistance-lowering agent is one or two or more selected from the group consisting of mineral acid salts and organic acid salts of cobalt, iron, indium, nickel, lead, tin, titanium, and zinc. For example, mixture of nickel acetate and ferric chloride, zinc naphthenate, mixture of tin octylate and antimony chloride, mixture of indium nitrate and lead acetate, or mixture of (acetyl acetic acid) titanium salt and cobalt octylate may be used as the resistance lowering agent. Preferably, the amount of the resistance-lowering agent is 0.2 to 15 parts by mass in 100 parts by mass of the composition for electro-conductive reflection film. Water soluble cellulose derivative is a nonionizing surface active agent and, compared to different types of surface active agents, has very high ability of dispersing metal nanoparticles even with small amount of addition. In addition, reflectivity of the electro-conductive reflection film formed of the composition is enhanced by the addition of the water soluble cellulose derivative. Examples of the water soluble cellulose derivative include hydroxypropyl cellulose, hydroxypropyl methyl cellulose or the like. The preferable amount of water soluble cellulose derivative is 0.2 to 5 parts by mass in 100 parts by mass of composition for electro-conductive reflection film.

Where necessary, another material such as additive agent selected from an antioxidant, a leveling agent, a thixotropic agent, a filler, and a stress relaxing agent, or the like may be blended, in an amount that does not disturb the intended purpose of the present invention, in the composition for an electro-conductive reflection film.

In consideration of reflectivity and conductivity, the amount of metal nanoparticles is preferably 75 parts by mass or more, more preferably 80 parts by mass or more in 100 parts by mass of the component excluding the dispersive medium of the composition for an electro-conductive reflection film. In consideration of adhesion of the electro-conductive reflection film, the amount of metal nanoparticles is preferably 95 parts by mass or less, and preferably 80 parts by mass or more.

The amount (proportion) of additive material is preferably 0.1 to 25 parts by mass, more preferably 0.2 to 10 parts by mass in 100 parts by mass of the component excluding the dispersive medium of the composition for electro-conductive reflection film. Satisfactory adhesion strength with the substrate is obtained where the amount is 0.1 parts by mass or more. Uneven film thickness is not likely to occur in the film formation process where the amount of additive material is 25 parts by mass or less.

[Overcoat Composition for Electro-Conductive Reflection Film for Light Emitting Element]

An overcoat composition (composition for overcoat) for electro-conductive reflection film for light emitting element according to the present invention is a composition for an overcoat for an electro-conductive reflection film of the light emitting element that has a light emitting layer, an electro-conductive reflection film that reflects the light emission from the light emitting layer, and a substrate in this order, where the overcoat composition includes a light transmitting binder. For example, when the overcoat composition is coated on the electro-conductive reflection film by a wet coating process, the electro-conductive reflection film include voids. It is possible to infiltrate the overcoat composition in the electro-conductive reflection film and fill the voids and/or interface between the electro-conductive reflection film and the substrate with the overcoat composition (effect 1). In addition, it is possible to further form a transparent electro-conductive film including a light transmitting binder between the light emitting layer and the electro-conductive reflection film (effect 2). Further, in the latter case, it is possible to form a light transmitting electro-conductive film constituted of two layers where the layer in the side of the electro-conductive reflection film has a higher refractive index than the refractive index of the layer in the side of the light emitting layer. Such a structure can be formed by preparing two types of overcoat composition, an overcoat composition for a high refractive index and an overcoat composition for a low refractive index. The constitution of the light emitting element having the light emitting layer, an electro-conductive reflection film that reflects light emission from the light emitting layer, and the substrate in this order will be described afterwards.

In consideration of adhesion, it is preferable to make the light transmitting binder include a thermosetting polymer type binder and/or thermosetting non-polymer type binder that are easily cured (hardened) after coating. Examples of the polymer type binder include acrylic resin, polycarbonate, polyester, alkyd resin, polyurethane, acrylic urethane, polystyrene, polyacetal, polyamide, polyvinyl alcohol, polyvinyl acetate, cellulose, siloxane polymer or the like. The polymer type binder preferably includes at least one selected from the group consisting of metal soaps, metal complexes, metal alkoxides, or hydrolyzates of a metal alkoxide of aluminum, silicon, titanium, chromium, manganese, iron, cobalt, nickel, silver, copper, zinc, molybdenum, and tin.

Examples of the non-polymer type binder include a metal soap, metal complexes, metal alkoxide, a hydrolyzate of metal alkoxide, an alkoxysilane, a halosilane, 2-alkoxyethanol, β-diketone, alkyl acetate or the like. Preferably, the metal included in the metal soap, metal complex, or the metal alkoxide is selected from aluminum, silicon, titanium, chromium, manganese, iron, cobalt, nickel, silver, copper, zinc, molybdenum, tin, indium or antimony. An alkoxide of silicon or titanium (for example, tetraethoxysilane, tetramethoxysilane, or butoxysilane) is more preferred. An example of the halosilanes is trichlorosilane. Curing by heating of the above-described polymer type binder and non-polymer type binder enables formation of a transparent electro-conductive film having high adhesion.

Preferably, a catalyst is contained in addition to the water component for starting hydrolysis in the time of hardening of the metal alkoxide, where the catalyst may be selected from acids such as hydrochloric acid, nitric acid, phosphoric acid ($H_3PO_4$), sulfuric acid, or alkali such as ammonia water and sodium hydroxide. It is preferable to use nitric acid, in consideration of the advantages in that the catalyst is easily evaporated and hardly remain after the heat-curing, residue of halogen is avoided, residue of P or the like having inferior water resistance is avoided, and adhesion after the coring is ensured.

Transparent electro-conductive particles are preferred so as to enhance the electro-conductive properties of a transparent electro-conductive film, and to suppress deterioration of the electro-conductive reflection film due to heat and light. Fine particles of oxide are preferred as the transparent electro-conductive particles based on the consideration of optical transmittance, stability, and weather resistance. Preferably, the transparent electro-conductive oxide particles are selected from a powder of tin oxide such as ITO (Indium Tin Oxide), ATO (Antimony Tin Oxide), and a powder of zinc oxide including at least one metal selected from the group consisting of Al, Co, Fe, In, Sn, and Ti, where ITO, ATO, AZO (Aluminum Zinc Oxide), IZO (Indium Zinc Oxide), TZO (Tin Zinc Oxide) are more preferred. The average particle diameter of the transparent electro-conductive particles is preferably in the range of 10 to 100 nm, more preferably in the range of 20 to 60 nm in order to maintain stability in the dispersion medium. Here the average particle diameter may be measured by a BET method based on measurement of specific surface area using QUANTACHROME AUTOSORB-1 or by dynamic light scattering method using LB-50 made by HORIBA Ltd. Where an explanation is not given, the average particle diameter may be measured by a BET method based on measurement of specific surface area using QUANTACHROME AUTOSORB-1. In consideration of dispersion and conductivity, a spherical shape or a needle shape are preferred as shapes of the transparent electro-conductive particles.

Preferably, the light transmitting binder is added with coupling agent corresponding to the other components used in the binder in order to improve adhesion between the transparent electro-conductive film and the electro-conductive reflection film and adhesion between the transparent electro-conductive film and the encapsulant material film, and to improve the adhesion between the transparent electro-conductive particles and the light transmitting binder. Examples of the coupling agent include a silane coupling agent, an aluminum coupling agent, and a titanium coupling agent.

An amount (proportion) of the light transmitting binder is preferably 10 to 90 parts by mass, more preferably 30 to 80 parts by mass, in 100 parts by mass of the transparent electro-conductive film excluding dispersion medium. The adhesion strength with the electro-conductive reflection film is satisfactory where the amount of the binder is 10 parts by mass or more, and uneven film thickness is not likely to occur in the film formation process where the amount of the binder is 90 parts by mass or less. Where metal alkoxide is used as the binder and nitric acid is used as the catalyst, it is preferable to use nitric acid of 1 to 10 parts by mass for metal alkoxide of 100 parts by mass in consideration of curing speed of the binder and the residual amount of nitric acid.

Preferably, the overcoat composition includes a dispersion medium in order to perform the film formation satisfactorily. The dispersion medium may be selected from similar materials used as the dispersion medium in the composition for electro-conductive reflection film.

Preferably, amount of the transparent electro-conductive particles is 10 to 90 parts by mass, more preferably 20 to 70 parts by mass in 100 parts by mass of the overcoat composition excluding the dispersion medium. Where the amount is not less than 10 parts by mass, it is possible to expect an effect to return the light feedback from the transparent electro-conductive film to the electro-conductive reflection film. Where the amount is not more than 90 parts by mass, the intensity of the transparent electro-conductive film itself and adhesion with the transparent electro-conductive reflection film and encapsulant material is maintained.

Where a coupling agent is used, the amount of the coupling agent is preferably 0.01 to 5 parts by mass, preferably, 0.1 to 2 parts by mass in 100 parts by mass of the over coat composition excluding the dispersing agent. Where the amount is not less than 0.01 parts by mass, improvement of adhesion with the electro-conductive reflection film and encapsulant material and remarkable improvement of particle dispersionability are exerted. Where the amount is more than 5 parts by mass, the film tends to be formed heterogeneously.

Preferably, a resistance lowering agent and/or a water-soluble cellulose derivative may be added to the overcoat composition in accordance with the correspondence to components used in composition. The resistance lowering agent and the water-soluble cellulose derivative may be selected from similar materials used in the composition for an electro-conductive reflection film.

Where necessary, an additive agent such as antioxidant, leveling agent, thixotropic agent, filler, stress relaxing agent, or the like in an amount within a range of not disturbing the object of the present invention may be blended in the overcoat composition.

Overcoat Composition for High Refractive Index

The above-described overcoat composition may be used as the overcoat composition for high refractive index. A method of producing over coat composition for still higher refractive index is explained below.

The overcoat composition for high refractive index (composition for overcoat of high refractive index) includes the above-described light-transmitting binder, transparent electro-conductive particles, and preferably, further includes transparent particles of at least one species selected from the group consisting of $SiO_2$ (refractive index: 1.54), $TiO_2$ (refractive index: 2.7), $ZrO_2$ (refractive index: 2), and diamond (refractive index: 2.4). With respect to the transparent electro-conductive particles, any one of the ITO, ATO, and zinc oxide including at least one metal selected from the group consisting of Al, Co, Fe, In, Sn, and Ti has a refractive index of about 2. The refractive index of the light transmitting binder is about 1.3 to 1.6.

Preferably, amount of the transparent electro-conductive particle is 10 to 90 parts by mass, more preferably 20 to 70 parts by mass in 100 parts by mass of the overcoat composition excluding the dispersing agent. Where the amount is not less than 10 parts by mass, it is possible to expect an effect to return the light feedback from the transparent electro-conductive film to the electro-conductive reflection film. Where the amount is not more than 90 parts by mass, the intensity of the transparent electro-conductive film itself and adhesion with the transparent electro-conductive film and encapsulant material may be maintained.

Based on the consideration for controlling the refractive index, the amount of the transparent particles is preferably 10 to 50 parts by mass in 100 parts by mass of the overcoat composition for high refractive index excluding the dispersing agent.

Content of the light-transmitting binder is preferably 10 to 90 parts by mass, more preferably 30 to 80 parts by mass in 100 parts by mass of the overcoat composition for high refractive index excluding the dispersing agent. Where the amount is not less than 10 parts by mass, satisfactory adhesion with the transparent electro-conductive film is obtained. Where the amount is 90 parts by mass or less, unevenness is not likely to occur during the film formation process.

Overcoat Composition for Low Refractive Index

The overcoat composition for low refractive index (composition for overcoat of low refractive index) contains the above-described light-transmitting binder, transparent electro-conductive particles, and preferably, further includes low refractive index transparent particles of at least one species selected from the group consisting of silsess quioxane particles (refractive index: 1.15 to 1.45) and magnesium fluoride particles (refractive index: 1.18 to 1.38). Preferably, the average particle diameter of the low refractive index transparent particles is 1 to 50 nm.

The low-refractive index overcoat composition includes 98 to 65 parts by mass, more preferably 95 to 70 parts by mass of the electro-conductive oxide particles in 100 parts by mass of the sum of the electro-conductive oxide particles and the low-refractive index transparent particles. Where the amount exceeds the upper limit, adhesion is deteriorated. Where the amount is less than the lower limit, the electro-conductivity is deteriorated.

The composition includes 2 to 35 parts by mass, preferably 5 to 30 parts by mass of the low-refractive index transparent particles in 100 parts by mass of the sum of the electro-conductive oxide particles and the low-refractive index transparent particles. Where the amount is less than the lower limit, it is impossible to sufficiently reduce the refractive index of the transparent electro-conductive film after the curing. Where the amount exceeds the upper limit, conductivity is deteriorated.

The content of the light transmitting binder is preferably 5 to 50 parts by mass, more preferably 10 to 30 parts by mass in 100 parts by mass of the low-refractive index overcoat composition excluding the dispersion medium.

Composition for Adhesion Layer

It is possible to form an electro-conductive reflection film having excellent adhesion with the substrate and excellent electrical connection by forming an adhesion layer on the substrate before forming the electro-conductive reflection film by wet-coating the composition for forming a reflection film and firing the composition.

Formation of the adhesion layer is performed by coating the below-described composition for adhesion layer on the substrate. Preferably, the composition for the adhesion layer includes at least one selected from the group consisting of metal oxides, resins, metal-alkoxides, metal soaps, and coupling agents. The metal oxide may be selected from $Ag_2O$, $CuO$, $PdO$, $ZnO$, $NiO$, $MoO_2$, $Cr_2O_3$, $MnO_2$, $Al_2O_3$, $ZrO$, $TiO_2$, $In_2O_3$, $SiO_2$ or the like. The resin may be selected from acrylic resin, vinyl acetate, epoxy resin, polyurethane, cellulose, polyvinylpyrrolidone, modified resins of the above-described resins, copolymer that includes any one of the above-described resins as a structure unit, or the like. The metal alkoxide may be selected from tetraethoxysilane, tetrabutoxysilane, titanium isopropoxide, zirconium butoxide or the like. The metal soap may be selected from calcium stearate, magnesium stearate, zinc stearate, tin 2-ethylhexanoate, or the like. The coupling agent may be selected from (3-mercaptopropyl)-methyldimethoxysilane, triethanolamine titanate or the like.

Light Emitting Element

The light emitting element according to the present invention includes a light emitting layer, an electro-conductive reflection film that reflects light emitted from the light emitting layer, and a substrate in this order, wherein the electro-conductive reflection film includes sintered body of metal nanoparticles.

Figure 1:
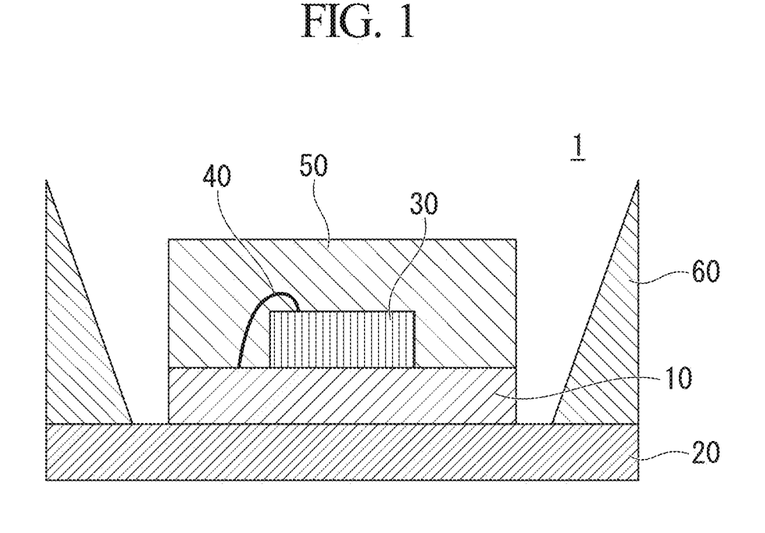
FIG. 1 is a cross-sectional drawing that shows an embodiment of a light emitting element according to the present invention.

FIG. 1 shows a cross sectional drawing of an embodiment of the light emitting element. The light emitting element 1 includes electro-conductive reflection film 10, and light emitting layer 30 sequentially stacked on the substrate (base plate) 20. Usually, the light emitting layer is connected to wiring by wire-bonding 40, and is subsequently sealed by the encapsulant material 50. In addition, surrounding of the light emitting layer 30 is covered by reflection flame 60 so as to utilize the light emitted from the light emitting layer effectively.

Figure 2:
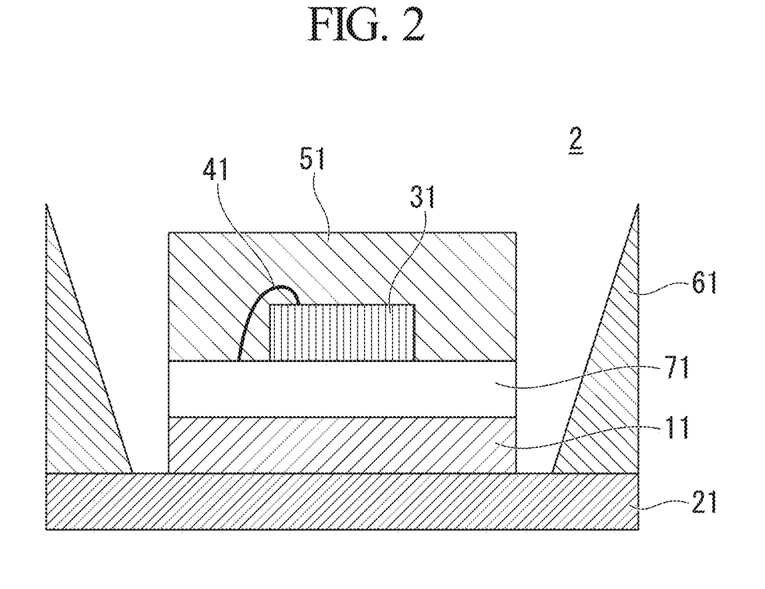
FIG. 2 is a cross-sectional drawing that shows a preferred embodiment of a light emitting element according to the present invention.

FIG. 2 shows a cross sectional view of an example of a preferable embodiment of the light emitting element. The light emitting element 2 has an electro-conductive reflection film 11, transparent electro-conductive film 71, and light emitting layer 31 stacked in this order on the substrate 21. In a similar manner as shown in FIG. 1, the light emitting layer 31 is connected to wiring by wire bonding 41, and is subsequently sealed by the encapsulant material 51. In addition, surrounding of the light emitting layer 31 is covered by a reflection flame 61. Where the transparent electro-conductive film 71 is disposed between the electro-conductive reflection film 11 and the light emitting layer 31 as shown in this embodiment, it is possible to enhance heat resistance and corrosion resistance of the light emitting element 2, thus preferable. More preferably, a light transmitting binder is contained in the transparent electro-conductive film, thus enabling formation of the film by a wet coating method. However, even though the transparent electro-conductive film is formed by a vacuum coating method, it is possible to enhance heat resistance and corrosion resistance of the light emitting element 2. FIG. 2 shows a cross sectional view of an example of the light emitting element.

Figure 3:
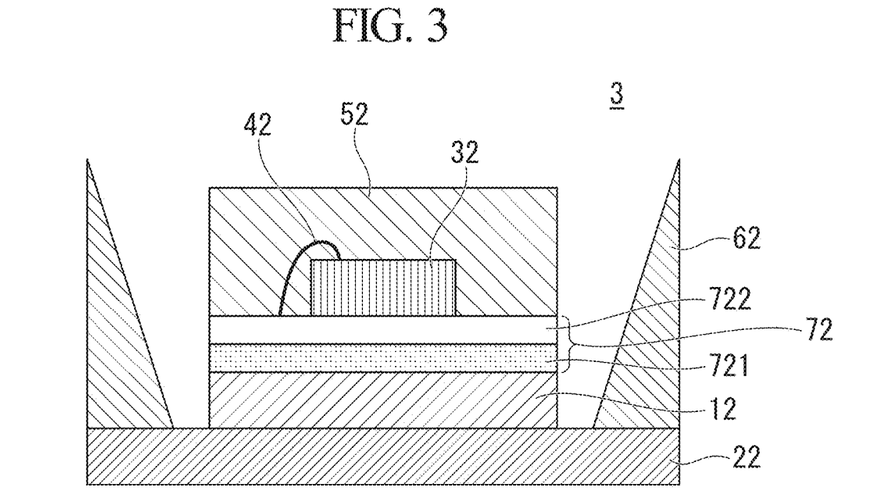
FIG. 3 is a cross-sectional drawing that shows a more preferred embodiment of a light emitting element according to the present invention.

FIG. 3 shows a cross-sectional view of a more preferable embodiment of the light emitting element. The light emitting element 3 includes an electro-conductive reflection film 12, a transparent electro-conductive film 72, and a light emitting layer 32 in this order on the substrate 22. The light emitting layer 32 is connected to wiring by the wire bonding 42 and is subsequently sealed by the encapsulant material 52. The surrounding of the light emitting layer 32 is covered by the reflection flame 62. The transparent electro-conductive film 72 disposed between the electro-conductive reflection film 12 and the light emitting layer 32 has a two layered structure including high refractive index transparent electro-conductive film (layer) 721 on the side of the electro-conductive reflection film 12 and a low refractive index electro-conductive film (layer) 722 on the side of the light emitting layer. By forming the transparent electro-conductive film 72 to a composite film having the two layered structure, it is possible to increase the light reflected by the reflection film 12. The reflection intensity by the electro-conductive reflection film 12 is further increased where the transparent electro-conductive film 72 is formed to have a plural layer structure (multi-layered structure) by stacking the high refractive index electro-conductive film, low-refractive index electro-conductive film, high refractive index electro-conductive film, low-refractive index electro-conductive film, . . . (the stacking may be continued), in this order from the side of the electro-conductive reflection film 12. That is, the transparent electro-conductive film 72 may be formed by stacking a plurality of complex films each having two layers consisting of a high refractive index electro-conductive film and a low-refractive index electro-conductive film. In this case, the transparent electro-conductive film 72 has a structure of alternately layered high refractive index electro-conductive film and low refractive index transparent electro-conductive film, wherein the layer closest to the light emitting layer consists of the low refractive index electro-conductive film, and the layer closest to the electro-conductive reflection film consists of high refractive index transparent electro-conductive film.

Figure 4:
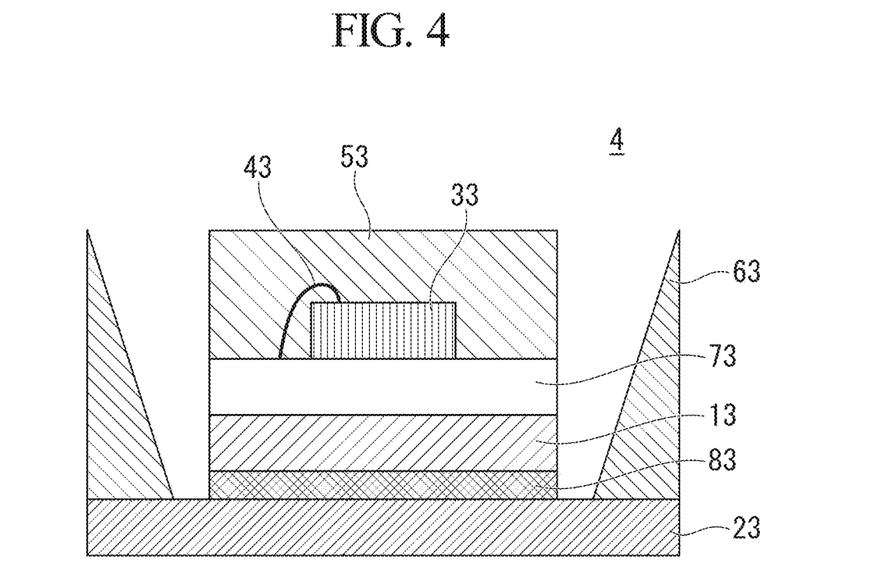
FIG. 4 is a cross-sectional drawing that shows a preferred embodiment of a light emitting element according to the present invention.

FIG. 4 is a cross sectional view that shows a preferable embodiment of the light emitting element. The light emitting element 4 shown in FIG. 4 comprises an adhesion layer 83 between the electro-conductive reflection film 13 and the substrate 23. The light emitting element 4 includes a substrate 23 and an adhesion layer 83, electro-conductive reflection film 13, transparent electro-conductive film 73, and a light emitting later 33 sequentially stacked on the substrate. The light emitting layer 33 is connected to wiring by wire bonding 43, and is subsequently sealed by sealing member 53. The surrounding of the light emitting layer 33 is covered by a reflection flame 63. The adhesion layer 83 improves the adhesion between the electro-conductive reflection film 13 and the substrate 23, and improves the reliability of the light emitting element. While the embodiment shown in FIG. 4 includes a transparent electro-conductive film 73, disposition of the adhesion layer 83 is also preferable in an embodiment in which the transparent electro-conductive film 73 is not formed.

In the following, the electro-conductive reflection film, transparent electro-conductive film, and adhesion layer are explained in order.

Electro-Conductive Reflection Film

The electro-conductive reflection film includes metal nanoparticles. Based on the consideration of adhesion and reflectivity, the electro-conductive reflection film preferably includes an additive material. The constitution of the metal nanoparticles and the additive material are explained above.

Based on the consideration of the reflectivity and conductivity, the thickness of the electro-conductive reflection film is preferably 0.05 to 1.0 μm, more preferably, 0.1 to 0.5 μm.

Preferably, pores (cavities) existing in the substrate-side face of the electro-conductive reflection film has an average diameter of 100 nm or less and average depth of 100 nm or less, and number density of $30/\mu m^2$. In this case, it is possible to achieve high diffuse reflectance of 80% or more of theoretical reflectance for the wavelength range of 380 to 780 nm. In general, reflection spectrum shows high reflectance in long-wavelength side and low reflectance in short-wavelength side. Where the average diameter of the pores exceeds 100 nm, inflection point showing the decrease of the reflectance shifts to relatively long wavelength side, resulting in failure to achieving satisfactory reflection. Therefore, the average diameter is preferably 100 nm or less. Where the average depth of the pores exceeds 100 nm, gradient (inclination) of the reflection spectrum is enlarged, resulting in failure to achieving satisfactory reflection. Therefore, the average depth of the pores is preferably 100 nm or less. Where the number density of the pores exceeds $30/\mu m^2$, reflectance for the long wavelength light is reduced resulting in failure to achieving satisfactory reflectance. Therefore, number density of the pores is preferably $30/\mu m^2$ or less.

Where the electro-conductive reflection film includes pores, presence of the light transmitting binder in the pores of the electro-conductive reflection film and/or in the interface between the electro-conductive reflection film and the substrate is preferred since the presence of the light transmitting binder further enhances the heat resistance and corrosion resistance of the electro-conductive reflection film and improves adhesion between the electro-conductive reflection film and the substrate. The light transmitting binder in the pores of the electro-conductive reflection film and/or in the interface between the electro-conductive reflection film and the substrate can be formed by wet coating the overcoat composition on the electro-conductive reflection film and firing the composition.

Figure 5:
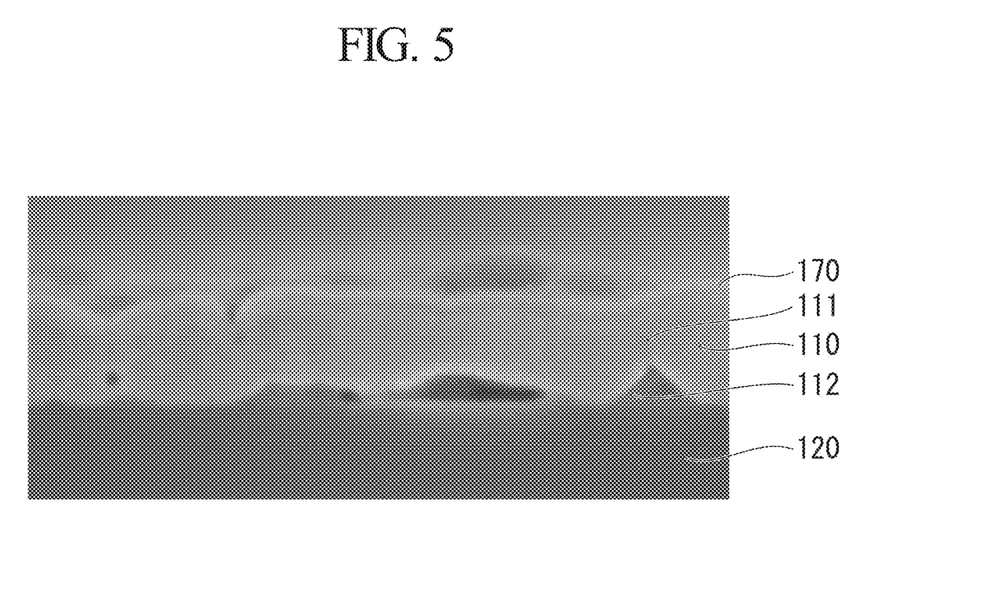
FIG. 5 is a scanning electron microscopic photograph of a cross section of a substrate having electro-conductive reflection film and the like formed thereon.

FIG. 5 shows a photograph obtained by scanning electron microscope that shows a cross section of a substrate and electro-conductive reflection film or the like formed thereon. In FIG. 5, electro-conductive reflection film 110 is formed on the substrate 120, and light transmitting binder 111 in the pores of the electro-conductive reflection film and light transmitting binder 112 in the interface between the electro-conductive reflection film and the substrate are observed. In addition, a transparent electro-conductive film 170 is formed on the electro-conductive reflection film 110.

Transparent Electro-Conductive Film

Formation of the transparent electro-conductive film between the light emitting layer and the electro-conductive reflection layer is preferred since its presence suppresses heat induced deterioration and photo induced deterioration of the electro-conductive reflection film. The transparent electro-conductive film has the light transmitting binder of the above-described constitution and preferably includes transparent electro-conductive particles, coupling agent, or the like.

Where necessary, additive agent or the like such as filler and stress relaxing agent may be blended in the transparent electro-conductive film within a range not disturbing the purpose of the present invention.

Considering the adhesion, the transparent electro-conductive film preferably has a thickness of 0.01 to 0.5 μm, more preferably 0.02 to 0.1 μm. Where the thickness of the transparent electro-conductive film is smaller than 0.01 μm or larger than 0.5 μm, sufficient adhesion cannot be obtained.

Preferably, the transparent electro-conductive film has a two layered structure, where a transparent electro-conductive film (high refractive index transparent electro-conductive film) on the side of the electro-conductive reflection film is higher than the refractive index of the transparent electro-conductive film (low-refractive index transparent electro-conductive film) on the side of the light emitting layer. As explained above, reflectance by the electro-conductive reflection film is increased by such conditions.

Adhesion Layer

The adhesion layer improves adhesion between the electro-conductive reflection film and the substrate. The adhesion layer preferably has a thickness of 0.01 to 0.5 μm. Where the thickness of the adhesion layer is 0.01 μm or more, sufficient adhesion can be obtained. Where the thickness of the adhesion layer is 0.5 μm or less, time-dependent deterioration is suppressed.

Method of Producing Light Emitting Element

A method of producing a light emitting element according to the invention includes: forming an electro-conductive reflection film by coating a composition for electro-conductive reflection film containing metal nanoparticles and additive material on the substrate by wet coating method, and subsequently firing or curing the composition; and disposing a light emitting layer on the electro-conductive reflection film.

Firstly, a composition for electro-conductive reflection film containing metal nanoparticles and additive material is coated on the substrate by wet coating method. Here, the coating is performed such that the thickness of the film after the firing is 0.05 to 1.0 μm, and more preferably 0.1 to 0.5 μm. Next, the coated film is dried at a temperature of 120 to 350° C., and preferably 150 to 250° C., for 5 to 60 minutes, preferably 15 to 40 minutes. Thus, the electro-conductive reflection film is formed.

The material of the substrate is not particularly limited provided that the light emitting layer can be disposed on the substrate. For example, silicon, ceramics, polymer materials, Cu, Al, or the like can be used.

The composition for electro-conductive reflection film can be prepared by mixing the desired components by a general mixing method, for example, using a paint shaker, a ball mill, a sand mill, a centri-mill, three-roll mill, or the like, and by dispersing the light transmitting binder and optionally dispersing transparent electro-conductive particles or the like in the mixture. The composition may also be formed by a general agitation process. Preferably, after mixing the components, excluding metal nanoparticles, the mixed components are mixed with a dispersion containing the metal nanoparticles preliminarily prepared by dispersing the metal nanoparticles so as to achieve a homogeneous composition for electro-conductive reflection film easily.

Preferably, the wet coating method may be selected from any one from a spray coating method, a dispenser coating method, a spin-coating method, a knife-coating method, a slit-coating method, an inkjet coating method, a screen coating method, an offset coating method, or a die coating method. On the other hand, the wet coating method is not limited to the above-described method. It is possible to utilize any wet coating method.

In the spray coating method, the composition for electro-conductive reflection film is formed into a mist by the compressed air or the dispersion itself is pressurized to form a mist and is coated on the substrate. In the dispenser coating method, for example, the composition for electro-conductive reflection film is filled in a syringe (injector), and the dispersion is injected from the small nozzle at the end of the syringe by pressing the piston of the syringe, and is coated on the substrate. In the spin coating method, composition for electro-conductive reflection film is dropped on the rotating substrate, and the dropped composition for electro-conductive reflection film is spread towards the circumferential edge of the substrate by the centrifugal force. In the knife coating method, a substrate is placed in horizontally movable state with a predetermined space from the edge of a knife, composition for electro-conductive reflection film is provided on the substrate in the upstream area with respect to the knife, and the substrate is moved horizontally to the downstream area. In the slit-coating method, composition for electro-conductive reflection film is outflowed from the narrow slit and is coated on the substrate. In the inkjet coating method, the composition for electro-conductive reflection film is filled in a ink-cartridge of a commercially available inkjet printer, and inkjet-printed on the substrate. In the screen printing method, a gauze is used as a patterning supporting member, and an engraved pattern on the gauze is printed to the substrate by the composition for electro-conductive reflection film. In the offset printing method, composition for electro-conductive reflection film painted on the printing block is not directly adhered to the substrate, but is firstly transcripted to a rubber sheet, and is transcripted from the rubber sheet to the substrate utilizing water-repellent property of the composition for electro-conductive reflection film. In the die coating method, the composition for electro-conductive reflection film provided to the die is distributed by manifold, and is ejected on the thin film from the slit, thereby coating the surface of the running substrate. The die coating method includes a slot-coating method, a slide-coating method, and a curtain coating method.

Finally, the substrate having an electro-conductive reflection coating is fired by holding the substrate at a temperature of preferably 130 to 250° C., more preferably 180 to 220° C., for 5 to 60 minutes, preferably 15 to 40 minutes in the air or in an inert gas atmosphere such as nitrogen and argon. Where the binder is reacted by hydrolysis or the like, it is possible to perform curing at a lower temperature.

The preferable range of the firing temperature of the substrate with the coated film is 130 to 250° C. since the temperature lower than 130° C. results in insufficient curing. Where the temperature exceeds 250° C., it is impossible to utilize the advantage of low-temperature process in productivity, resulting in increased production cost and reduction of productivity. Where the light emitting layer is a LED element, the light emitting layer is relatively sensitive to heat, and luminous efficiency is deteriorated by the firing process.

The time for firing the substrate with the coating is preferably in the range of 5 to 60 minutes for the following reason. A firing time shorter than the lower limit causes defective result in that firing of a binder in the electro-conductive reflection film is insufficient. A firing time exceeding the upper limit causes unnecessary increase of production cost resulting in reduction of productivity and defective deterioration of luminous efficiency of the light emitting layer.

The method of disposing (equipping) the light emitting layer on the formed electro-conductive reflection film is not particularly limited. Where the light emitting layer is a LED element, a generally known method such as die bonding may be used.

As explained above, vacuum processes such as vacuum deposition and sputtering can be avoided as possible by utilizing the wet coating method in the present invention. Therefore it is possible to produce electro-conductive reflection film at relatively low cost, and to produce the light emitting element according to the present invention having high heat resistance and corrosion resistance easily at low cost.

It is preferable to form a transparent electro-conductive film on the electro-conductive reflection film after forming the electro-conductive reflection film and before forming the light emitting layer by coating a composition for transparent electro-conductive film including light transmitting binder on the electro-conductive reflection film by wet coating method and subsequently firing or curing the composition. In this case, heat resistance and corrosion resistance of the light emitting element can be further enhanced. Where the transparent electro-conductive film is constituted of two or more layers of high refractive index transparent electro-conductive films and low-refractive index transparent electro-conductive films, the transparent electro-conductive film may be formed by coating the composition for high refractive index transparent electro-conductive film and composition for low refractive index transparent electro-conductive film in this order on the electro-conductive reflection film.

The method of producing the composition for transparent electro-conductive film, method of wet coating the composition, and method of firing or curing the composition are substantially similar to those for the composition for electro-conductive reflection film. In the case of the composition for transparent electro-conductive film, the thickness after the filing is controlled to be 0.01 to 0.5 μm, preferably, 0.02 to 0.08 μm.

In the case of forming an adhesion layer, the composition for forming an adhesion layer is coated on the substrate before wet-coating the composition for electro-conductive reflection film. The method of producing the composition for the adhesion layer, the method of wet coating the composition, and method of firing or curing the composition are substantially similar to those for the case of a composition for an electro-conductive reflection film. In the case of a composition for the adhesion layer, the thickness after the filing is preferably controlled to be 0.01 to 0.5 μm.

According to the above-described preferable production method, it is possible to produce a transparent electro-conductive film at relatively low cost by utilizing the wet-coating method, and to produce a light emitting element having higher heat resistance and corrosion resistance with a simple process at a low cost.

EXAMPLES

Hereafter, the present invention is explained in detail with reference to the examples. It should be noted that the present invention is not limited to the examples.

Example 1

Firstly, composition for electro-conductive reflection film was prepared. The following is the sequence of the preparation process.
Preparation of the Composition for Electro-Conductive Reflection Film.

Aqueous solution of metal salt was prepared by dissolving silver nitrate in deionized water. On the other hand, aqueous solution of sodium citrate having a concentration of 26% was prepared by dissolving sodium citrate in deionized water. Aqueous solution of reductant containing citrate ion and ferrous ion in molar ratio of 3:2 was prepared by directly adding granular ferrous sulfate to the aqueous solution of sodium citrate in the atmosphere of nitrogen gas flow maintained at a temperature of 35° C.

Next, while maintaining the nitrogen gas flow at 35° C., stirring bar of magnetic stirrer was placed in the aqueous solution of reductant, and the above-described aqueous solution of metal salt was dropped in and was mixed with the aqueous solution of reductant while stirring the solution with a rotation rate of the stirring bar of 100 rpm. Here, the concentration of each solution was controlled such that an amount of aqueous solution of metal salt added to the aqueous solution of reductant was 1/10 of the amount of aqueous solution of reductant and that the reaction temperature was maintained at 40° C. even when an aqueous solution of a metal salt at room temperature was added. In addition, the mixing ratio of the aqueous solution of a reductant and an aqueous solution of metal salt was controlled such that molar ratio of each of citrate ions and ferrous ions in the aqueous solution of reductant was three times the total valence number of metal ions in the aqueous solution of metal salt was 3 times. After ending the dropping of the aqueous solution of metal salt in the aqueous solution of reductant, stirring of the mixed solution was continued for 15 minutes. By this process, silver nanoparticles were generated in the mixed solution, and a dispersion dispersing the silver nanoparticles was obtained. The dispersion dispersing the silver nanoparticles had a pH of 5.5, and stoichiometric amount of the silver nanoparticles generated in the dispersion was 5 g/litter.

The silver nanoparticles in the dispersion were deposited by leaving the dispersion dispersing the silver nanoparticles at room temperature. Aggregates of the deposited silver nanoparticles were separated by decantation. A dispersion was formed by adding deionized water to the separated aggregates of silver nanoparticles. After desalinizing the dispersion by ultrafiltration, the dispersion was further subjected to displacement cleaning by methanol, thereby controlling the amount of metal (silver) to be 50% by mass. After that, relatively large silver particles having a particle diameter exceeding 100 nm were separated by centrifugal separator while controlling the centrifugal force of the separator such that the dispersion contained a number average of 71% of silver nanoparticles having a primary particle diameter of 10 to 50 nm. That is, the dispersion of silver nanoparticles was prepared such that the proportion of silver nanoparticles having a primary particle diameter of 10 to 50 nm was 71% by number in 100% of all the silver nanoparticles. The thus obtained silver nanoparticles were chemically modified by a protective agent of sodium citrate.

The thus obtained metal nanoparticles were dispersed in mixed solution containing water, ethanol, and methanol by adding 10 parts by mass of the metal nanoparticles in 90 parts by mass of the mixed solution and mixing the solution added with the metal nanoparticles. Thus, composition for electro-conductive reflection film was prepared. The metal nanoparticles constituting the composition for electro-conductive reflection film contains 75% by mass or more of metal nanoparticles.

An electro-conductive reflection coating was formed by spin-coating of composition for electro-conductive reflection film on a glass substrate, and electro-conductive reflection film having a thickness of 200 nm was obtained by firing the coating for 20 minutes at 200° C. in nitrogen atmosphere. The thickness of the film was determined by observation of cross section of the film using a Scanning Electron Microscope (SEM: S-4300, SU-8000) provided by Hitachi High-Technologies Co, Ltd. The film thickness was measured in the same manner as in the other examples and comparative examples.

Example 2

After preparing dispersion solution of silver nanoparticles in the same manner as in Example 1, 10 parts by mass of the obtained metal nanoparticles were added and mixed with 90 parts by mass of mixed solution containing water, methanol, and ethanol, and were dispersed in the solution. Polyinylpyrrolidone (PVD, molecular weight: 360000) and tin acetate were added to the dispersion such that 96 parts by mass of metal nanoparticles were mixed with 4 parts by mass of PVP, thereby preparing a composition for electro-conductive reflection film. The metal nanoparticles constituting the composition for electro-conductive reflection film includes 75% by mass or more of metal nanoparticles. Next, electro-conductive reflection film having a thickness of 100 nm was obtained in the same manner as in Example 1.

Example 3

Firstly composition for overcoat was prepared. The following is the preparation process.
Preparation of Composition for Overcoat Firstly, $SiO_2$ binder used as the binder was produced by the following procedure. Using a four neck flask of 500 cm$^3$, ethoxysilane of 140 g was added with 140 g of ethylalcohol. While agitating the mixture, 1.7 g of 60% nitric acid was dissolved in 120 g of pure water, and the solution was added to the mixture in one time. The mixture added with the solution was subjected to a reaction at 50° C. for 3 hours.

100 parts by mass of ITO powder (average particle diameter: 25 nm), 30 parts by mass of $SiO_2$ binder, and 72.3 parts by mass of IPA were installed in total weight of 60 g in a glass bottle of 100 cm$^3$. Using 100 g of zirconia beads having a diameter of 0.3 mm (*Micro-High*, Showa Shell Sekiyu, K K), the mixture was subjected to dispersing treatment for 6 hours in a paint shaker. Thus, a composition for overcoat was prepared.

Except for difference shown in Table 3, electro-conductive reflection film having a thickness of 200 nm was prepared in the same manner as in Example 2. Transparent electro-conductive coating was prepared by spin-coating of the composition for overcoat on the electro-conductive reflection film, and a transparent electro-conductive film having a thickness of 10 nm was obtained by firing the coating at 160° C. for 30 minutes.

Example 4

Using the $SiO_2$ binder as the composition for overcoat, a transparent electro-conductive film having a thickness of 100 nm was obtained in the same manner as in Example 3.

Examples 5 to 23

Except for the composition and film thickness shown in Table 1 and Table 2, electro-conductive reflection film was prepared in the same manner as in Example 2 and a transparent electro-conductive film was prepared in the same manner as in Example 3 in each example.

Example 24

Copper nanoparticles were prepared in the same manner as the above-described silver nanoparticles. Dispersion solution of metal nanoparticles was obtained such that the silver nanoparticles and the copper nanoparticles were mixed in mass ratio of 92:4.

10 parts by mass of the obtained metal nanoparticles were added and mixed with 90 parts by mass of mixed solution containing water, methanol, and ethanol, and were dispersed in the solution. Polyinylpyrrolidone (PVD, molecular weight: 360000) and tin acetate were added to the dispersion such that 96 parts by mass of metal nanoparticles were mixed with 3 parts by mass of PVP, and 1 part by mass of tin acetate thereby preparing a composition for electro-conductive reflection film. The metal nanoparticles constituting the composition for electro-conductive reflection film includes 75% by mass or more of metal nanoparticles (silver nanoparticles+copper nanoparticles).

Next, electro-conductive reflection film having a thickness of 100 nm was obtained by spin coating the composition for electro-conductive reflection film used in Example 3 on a glass substrate to produce an electro-conductive reflection coating, and firing the coating at 200° C. for 20 minutes in a nitrogen atmosphere.

Example 25 to 31

Except for the composition and film thickness shown in Table 2, electro-conductive reflection film was prepared in the same manner as in Example 24, and transparent electro-conductive film was prepared in the same manner as in Example 3. Here copper nitrate was used as a raw material of Cu, iron sulfate was used as a raw material of Fe, chloraurate was used as a raw material of Au, manganese sulfate was used as a raw material of Mn, tin chloride was used as a raw material of Sn, and indium sulfate was used as a raw material of In.

Comparative Example 1

A silver film having a thickness of 100 nm was formed on a glass substrate using a sputtering method which is a kind of vacuum film formation method.

Comparative Example 2

A silver film having a thickness of 100 nm was formed on a glass substrate using a sputtering method. Further, a titanium film having a thickness of 30 nm was formed using a sputtering method.

Example 32

A titanium film having a thickness of 30 nm was formed on the electro-conductive reflection film of Example 5 using a sputtering method.

Example 33

Composition for adhesion layer was spin-coated on a glass substrate. An adhesion layer having a thickness of 50 nm was formed by firing the coated composition at 120° C. for 30 minutes in nitrogen atmosphere. An electro-conductive reflection film having a thickness of 100 nm was prepared in the same manner as in Example 4 except for the composition and film thickness shown in Table 2. An overcoat composition was coated on the electro-conductive reflection film, thereby forming a transparent electro-conductive film having a thickness of 50 nm. Here, a silane coupling agent ((3-mercaptopropyl)-methyldimethoxysilane) was used as the composition for the adhesion layer.

Example 34

A reflection film was prepared in the same manner as in Example 33 except that the thickness of the adhesion layer was 300 nm, and the transparent electro-conductive film was not formed.

Example 35

An adhesion layer was formed on a glass substrate. Next, composition for reflection film containing silver nanoparticles was coated on the adhesion layer by spin-coating, and a reflection film was obtained by firing the coating at 200° C. for 20 minutes in a nitrogen atmosphere. A composition for low refractive index overcoat was prepared by mixing 60 pats by mass of $SiO_2$ binder and 40 parts by mass of silsess quioxane having an average particle diameter of 10 nm. A low refractive index transparent electro-conductive film having a thickness of 30 nm and refractive index of 1.20 was obtained by spin-coating the composition for low refractive index overcoat and filing the composition at 160° C. for 20 minutes in nitrogen atmosphere. In the similar manner, composition for high refractive index overcoat was prepared by mixing 70 parts by mass of $SiO_2$ binder and 30 parts by mass of $TiO_2$ having an average particle diameter of 20 nm, and a high refractive index transparent electro-conductive film having a thickness of 30 nm and a refractive index of 1.45 was formed by spin-coating the composition for high refractive index overcoat and firing the composition at 160° C. for 20 minutes in nitrogen atmosphere. composition for low refractive index overcoat containing silsess quioxane (in Table 3, described as silsess quioxane) was prepared by installing 5 g of spherical silsess quioxane particles, 10 g of $SiO_2$ binder, and 85 g of ethanol on glass bottle of 100 $cm^3$, and subjecting the mixture dispersing treatment for 6 hours using 100 g of zirconia beads having a diameter of 0.3 mm (*Micro-High*, Showa Shell Sekiyu, K K) in a paint shaker.

Example 36

A reflection film and a low refractive index transparent electro-conductive film were prepared in the same manner as in Example 35 except that the composition and film thickness were controlled as shown in Table 3.

Measurement of Reflectance

In the evaluation of reflectance of Examples 1 to 36 and Comparative Examples 1 to 2, diffuse reflectance of the electro-conductive reflection film for wavelength of 450 nm was measured using a combination of ultraviolet visible spectrophotometer and an integrating sphere. Heat treatment test was performed at 200° C. for 1000 hours. A sulfurization test as a corrosion resistance test was performed using hydrogen sulfide of 10 ppm, at a temperature of 25° C., relative humidity of 75% RH, for 504 hours. Reflectance of each sample was measured after the each test. The results are shown in Tables 1, 2, and 3.

Evaluation of Adhesion

After the measurement of reflectance, Examples 2, 33, and 34 were subjected to evaluation of adhesion using a method in accordance with tape test of JIS K-5600. In each test, a tape was adhered to the film formed on the sample, and a state of the film was observed after detaching the tape. Adhesion of the film was evaluated in three grades (excellent, acceptable, bad) based on the state of the film such as exfoliation or turning up of the half-exfoliated film.

The adhesion was evaluated as excellent where the film forming material was not adhered to the tape and only the bonding tape was detached.

The adhesion was evaluated as acceptable where areas only showing detachment of the bonding tape and areas exposing the photoelectric conversion layer 2 as the substrate were mixed in the sample. The adhesion was evaluated as bad where the photoelectric conversion layer 2 as the substrate was exposed in the all area. Example 2 was evaluated as acceptable, and Examples 33 and 34 were evaluated as excellent.

TABLE 1

| | Composition for electro-conductive reflection film | | Film thickness [nm] | | Reflectance [%] (450 nm) | | |
|---|---|---|---|---|---|---|---|
| | Metal nanoparticles | Additive material | Electro-conductive reflection film | Transparent electro-conductive film | Initial state | After heat treatment | After sulfurization test |
| Example 1 | Ag: 100% by mass | — | 200 | — | 85 | 75 | 29 |
| Example 2 | Ag: 96% by mass | PVP: 4% by mass | 100 | — | 86 | 76 | 30 |
| Example 3 | Ag: 95% by mass | Zn acetate: 5% by mass | 200 | 10 | 82 | 79 | 74 |
| Example 4 | Ag: 95% by mass | Cu acetate: 5% by mass | 150 | 100 | 84 | 78 | 82 |
| Example 5 | Ag: 99% by mass | PVP: 0.9% by mass SiO$_2$: 0.1% by mass | 100 | 50 | 86 | 85 | 84 |
| Example 6 | Ag: 95% by mass | PVP: 4 by mass ITO: 1% by mass | 120 | 70 | 83 | 82 | 82 |
| Example 7 | Ag: 95% by mass | PVP: 4 by mass ATO: 1% by mass | 260 | 200 | 85 | 83 | 77 |
| Example 8 | Ag: 95% by mass | PVP: 4% by mass TiO$_2$: 1% by mass | 740 | 340 | 81 | 80 | 77 |
| Example 9 | Ag: 95% by mass | PVP: 4% by mass MnO$_2$: 1% by mass | 620 | 160 | 83 | 81 | 80 |
| Example 10 | Ag: 95% by mass | PVP: 4% by mass Fe$_2$O$_3$: 1% by mass | 70 | 100 | 85 | 82 | 80 |
| Example 11 | Ag: 95% by mass | PVP: 4% by mass MoO$_2$: 1% by mass | 410 | 30 | 82 | 80 | 78 |
| Example 12 | Ag: 90% by mass | PVP: 9% by mass Al$_2$O$_3$: 1% by mass | 90 | 160 | 84 | 83 | 79 |
| Example 13 | Ag: 95% by mass | PVP: 4% by mass Cu(OH)$_2$: 1% by mass | 180 | 290 | 83 | 81 | 78 |
| Example 14 | Ag: 95% by mass | PVP: 4% by mass Zn(OH)$_2$: 1% by mass | 580 | 190 | 82 | 80 | 76 |
| Example 15 | Ag: 95% by mass | PVP: 4% by mass Al(OH)$_3$: 1% by mass | 370 | 310 | 82 | 81 | 80 |
| Example 16 | Ag: 95% by mass | PVP: 4% by mass Mn(OH)$_2$: 1% by mass | 690 | 250 | 84 | 81 | 77 |
| Example 17 | Ag: 95% by mass | PVP: 4% by mass Fe(OH)$_2$: 1% by mass | 460 | 360 | 82 | 80 | 79 |

TABLE 2

| | Composition for electro-conductive reflection film | | Film thickness [mm] | | Reflectance [%] (450 nm) | | |
|---|---|---|---|---|---|---|---|
| | Metal nanoparticles | Additive material | Electro-conductive reflection film | Transparent electro-conductive film | Initial state | After heat treatment | After sulfurization test |
| Example 18 | Ag: 95% by mass | PVP: 4% by mass Sn acetate: 1% by mass | 750 | 430 | 84 | 82 | 78 |
| Example 19 | Ag: 95% by mass | PVP: 4 by mass Methyl silicate: 1% by mass | 350 | 200 | 86 | 84 | 79 |
| Example 20 | Ag: 95% by mass | PVP: 4 by mass Titanium isopropoxide: 1% by mass | 890 | 350 | 84 | 83 | 78 |
| Example 21 | Ag: 95% by mass | PVP: 4% by mass Co formate: 1% by mass | 310 | 140 | 85 | 82 | 80 |

TABLE 2-continued

| | Composition for electro-conductive reflection film | | Film thickness [nm] | | Reflectance [%] (450 nm) | | |
|---|---|---|---|---|---|---|---|
| | Metal nanoparticles | Additive material | Electro-conductive reflection film | Transparent electro-conductive film | Initial state | After heat treatment | After sulfurization test |
| Example 22 | Ag: 95.9% by mass | PVP: 4% by mass<br>Mn formate: 0.1% by mass | 910 | 460 | 83 | 81 | 78 |
| Example 23 | Ag: 95.9% by mass | PVP: 4% by mass<br>Fe citrate: 0.1% by mass | 270 | 80 | 81 | 80 | 75 |
| Example 24 | Ag: 92% by mass<br>Cu: 4% by mass | PVP: 3% by mass<br>Sn acetate: 1% by mass | 170 | 100 | 86 | 84 | 82 |
| Example 25 | Ag: 95.8% by mass<br>Fe: 0.2% by mass | Methyl cellulose: 4% by mass | 550 | 60 | 82 | 81 | 77 |
| Example 26 | Ag: 89% by mass<br>Au: 5% by mass | Methyl cellulose: 5% by mass<br>Mo acetate: 1% by mass | 150 | 500 | 84 | 82 | 79 |
| Example 27 | Ag: 92% by mass<br>Cu: 4% by mass | PVP: 3% by mass<br>Ag citrate: 1% by mass | 700 | 20 | 81 | 79 | 77 |
| Example 28 | Ag: 96.8% by mass<br>Mn: 0.2% by mass | PVP-dimethylaminoethyl methacrylate: 2% by mass<br>Sn acetate: 1% by mass | 400 | 40 | 83 | 81 | 79 |
| Example 29 | Ag: 95.8% by mass<br>Sn: 0.2% by mass | Hydroxypropyl Methylcellulose: 3% by mass<br>ZnO: 1% by mass | 1000 | 60 | 81 | 78 | 76 |
| Example 30 | Ag: 96.8% by mass<br>In: 0.2% by mass | PVP: 2% by mass<br>Ni acetate: 1% by mass | 50 | 430 | 81 | 80 | 79 |
| Example 31 | Ag: 96.8% by mass<br>Mn: 0.2% by mass | PVP: 2% by mass<br>Cu acetate: 1% by mass | 230 | 90 | 85 | 84 | 83 |
| Comparative 1 | — | — | 100 | — | 87 | 66 | 14 |
| Comparative 2 | — | — | 100 | 30 | 80 | 78 | 65 |
| Example 32 | Ag: 99% by mass | PVP: 0.9% by mass<br>$SiO_2$: 0.1% by mass | 100 | 50 | 79 | 77 | 75 |
| Example 33 | Ag: 99% by mass | PVP: 1% by mass | 100 | 50 | 82 | 81 | 79 |
| Example 34 | Ag: 99% by mass | PVP: 1% by mass | 100 | 0 | 82 | 76 | 30 |

TABLE 3

| | Metal nanoparticles | Additive material | Low refractive index | High refractive index | Reflection enhancing film | Reflection film | Support film | Initial state | After heat treatment | After sulfurization test |
|---|---|---|---|---|---|---|---|---|---|---|
| Example 35 | Ag: 99% by mass | PVP: 1% by mass | silsess quioxane | $SiO_2$ binder: 70% by mass<br>$TiO_2$ particles: 30% by mass | 60 | 70 | 100 | 85 | 82 | 80 |
| Example 36 | Ag: 99% by mass | PVP: 0.9% by mass<br>$SiO_2$: 0.1% by mass | silsess quioxane | $SiO_2$ binder | 70 | 200 | 60 | 89 | 87 | 85 |

As it is obvious from Table 1, Examples 1 and 2 showed high reflectance in initial state and after the heat treatment, and maintained reflectance of about 30% after the sulfurization test. On the other hand, Comparative Example 1 formed by a sputtering method showed high reflectance in initial state, but showed severe deterioration after the heat treatment, and showed a large decrease of reflectance to 14% after the heat treatment. Examples 3 to 31 showed a very high reflectance in the initial state, in the state after the heat treatment, and in the state after the sulfurization test. As a result, it was confirmed that a light emitting element having very high heat resistance and corrosion resistance and showing little deterioration by temperature elevation due to high power light emitting layer could be produced. On the other hand, Comparative Example 2 prepared by the sputtering method showed low reflectance of 65% after the sulfurization test. Compared to Example 5, Example 32 having a Ti thin film formed by sputtering method on the film equivalent to Example 5 showed inferior results in initial state, after the heat treatment, and after the sulfurization test. Examples 33 and 34 having adhesion layers showed high reflectance. In Examples 35 and 36 having low refractive index transparent electro-conductive film and high refractive index transparent electro-conductive film showed high reflectance in initial state and showed small decrease of reflectance after the heat treatment and sulfurization test.

The light emitting element of the present invention has an electro-conductive reflection film containing metal nanoparticles between the substrate and the light emitting layer. By this constitution, even in a high power light emitting element, it is possible to enhance heat resistance and corrosion resistance, and to suppress deterioration of the electro-conductive reflection film due to heat generated by the light emitting layer or due to environment. Since the electro-conductive reflection film can be manufactured by a wet coating method, it is possible to decrease the cost by simplifying the production process. In addition, where a transparent electro-conductive film containing light transmitting binder is further provided between the light emitting layer and the electro-conductive reflection film, it is possible to further enhance the heat resistance and photo-resistance, and to further improve the adhesion between the substrate and the light emitting layer. Therefore, the above-described constitution is very advantageous.

INDUSTRIAL APPLICABILITY

Where an electro-conductive reflection film of a light emitting element is formed by using the composition of the present invention, it is possible to suppress deterioration of the electro-conductive reflection film due to heat generated by the light emitting layer or due to environment and thereby prolonging service life of the light emitting element even when the light emitting element has high power output. According to the present invention, the light emitting element having high heat resistance and corrosion resistance can be produced by a simple process at low cost.

The invention claimed is:

1. A method of producing a light emitting element, comprising:
   forming an electro-conductive reflection film by coating a composition for the electro-conductive reflection film containing metal nanoparticles and an additive material on a substrate by a wet-coating method, and subsequently drying the composition for the electro-conductive reflection film at 150 to 350° C. and firing or curing the dried composition for the electro-conductive reflection film;
   disposing a light emitting layer on the electro-conductive reflection film;
   disposing a transparent electro-conductive film by coating a composition for overcoat containing light transmitting binder, transparent electro-conductive particles and transparent particles on the electro-conductive reflection film by the wet-coating method after forming the electro-conductive reflection film and before forming the light emitting layer, and subsequently firing or curing the composition for overcoat; and
   forming an adhesion layer between the electro-conductive reflection film and the substrate, and the adhesion layer has a thickness of 0.01 to 0.5 µm.

* * * * *